United States Patent [19]

Shoji

[11] Patent Number: 4,516,123

[45] Date of Patent: May 7, 1985

[54] INTEGRATED CIRCUIT INCLUDING LOGIC ARRAY WITH DISTRIBUTED GROUND CONNECTIONS

[75] Inventor: Masakazu Shoji, Warren, N.J.

[73] Assignee: AT&T Bell Laboratories, Murray Hill, N.J.

[21] Appl. No.: 453,180

[22] Filed: Dec. 27, 1982

[51] Int. Cl.³ .................. H04Q 3/00; H03K 19/20
[52] U.S. Cl. .................. 340/825.86; 307/200 B; 307/468; 307/445; 340/825.87
[58] Field of Search .......... 340/825.9, 825.83, 825.86, 340/825.89, 825.87, 825.91, 825.93; 307/597, 200 A, 297, 200 B, 465, 468, 445; 365/94, 103, 203, 214; 357/40, 41; 364/716

[56] References Cited

U.S. PATENT DOCUMENTS 3,942,164  3/1976  Dunn .................................. 365/214
4,405,996  9/1983  Stewart .............................. 365/203

Primary Examiner—Donald J. Yusko
Attorney, Agent, or Firm—Herbert M. Shapiro

[57] ABSTRACT

Logic arrays which apply outputs to logic circuitry are made to exhibit improved noise characteristics which, in turn, improve performance of the logic circuitry. The improvement is achieved by providing a distributed ground throughout the logic array to provide local closed loop paths for discharge currents generated in the array. In this manner, discharge currents are not allowed to flow in ground or power BUSES and so do not affect the driven logic circuitry.

8 Claims, 9 Drawing Figures

INTEGRATED CIRCUIT INCLUDING LOGIC ARRAY WITH DISTRIBUTED GROUND CONNECTIONS

TECHNICAL FIELD

This invention relates to semiconductor integrated circuits (IC's) and, more particulary, to logic circuits such as CMOS (Complementary Metal-Oxide-Semiconductor) microprocessors.

BACKGROUND OF THE INVENTION

A CMOS microprocessor comprises dynamic and static logic circuits including a plurality of CMOS transistors. Each transistor is formed by photolithographic techniques and is comprised of a plurality of layers of semiconductor material in a field effect transistor (FET) configuration. The FET's are interconnected by polysilicon and metallic patterns as is well known.

Such a FET has a characteristic threshold and, ofter, noise causes voltage excursions on the polysilicon and metallic lines which exceed that threshold and cause unwanted switching of the FET to occur. For example, it is common for the FET's in a microprocessor to be organized into a programmable logic array (PLA), having Decoder and ROM portions, with associated ground and power BUSES. The stored charges in such FET's often produce voltages which are operative to discharge similar FET's, associated with the ground and power BUSES by exceeding the voltage thresholds at which such associated FET's respond. A consequence of such unwanted switching is reduced operating margins and lower chip yield as is well understood.

BRIEF DESCRIPTION OF THE INVENTION

The invention is based on the recognition that a PLA can be organized such that discharge currents of FET's in the PLA can be made to circulate only within the PLA structure itself and need not affect the FET's associated with the power or the ground BUSES. In this manner, noise induced voltages do not result in voltage excursions which cause unwanted switching of the FET's connected to the PLA BUSES.

In one embodiment, a ground switch (FET) is provided for each of a plurality of word lines in the decoder portion of a PLA and the source electrode of the switch in each instance is connected to a common ground of the decoder portion. This organization is in contradistinction to the typical prior art organization employing a single ground switch for all the word lines of the decoder portion. The former organization recirculates noise currents in internal loops without deleterious noise induced voltage excursions, whereas the latter produces stored charges in the ground and power BUSES leading to the reduction in margins and yield discussed hereinbefore.

DETAILED DESCRIPTION

Figure 1:
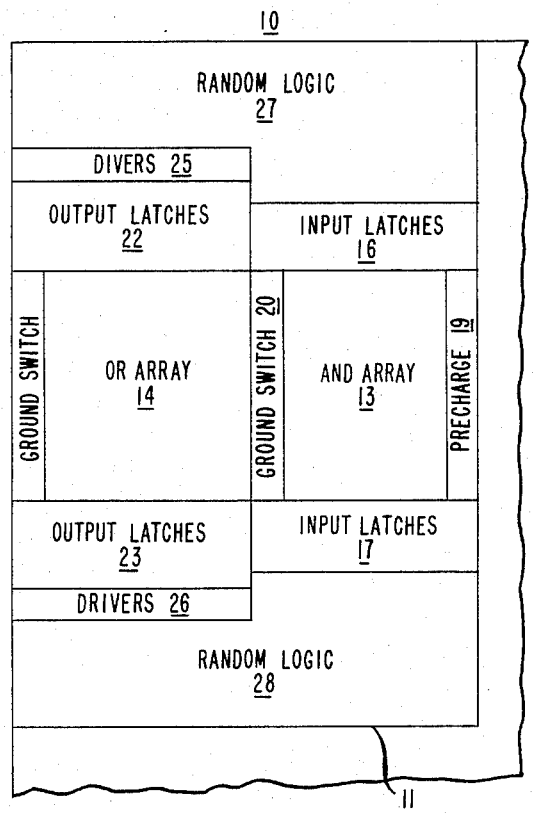
FIG. 1 shows a representation of an IC chip including a PLA of a typical microprocessor shown in block diagram form.

FIG. 1 shows an integrated circuit chip 10 including a PLA 11. The PLA includes first and second logic arrays 13 and 14. We will adopt the convention in which these arrays are designated as an "AND " (or "decoder") array and an "OR" (or "ROM") array, respectively, where "ROM" stands for read only memory. Input latches are conveniently arranged to either side of the AND array as indicated by blocks 16 and 17 and the conventional precharge circuitry and ground switches are represented by blocks 19 and 20.

The OR array conveniently has output latches to either side as represented by blocks 22 and 23. Output drivers are represented by blocks 25 and 26. The random logic circuits common to such PLA's to apply opcodes from an instruction register to the imputs to array 13 and to apply outputs from the OR array 14 to instruction BUS structures or to other PLA's are represented by blocks 27 and 28.

Figure 2:
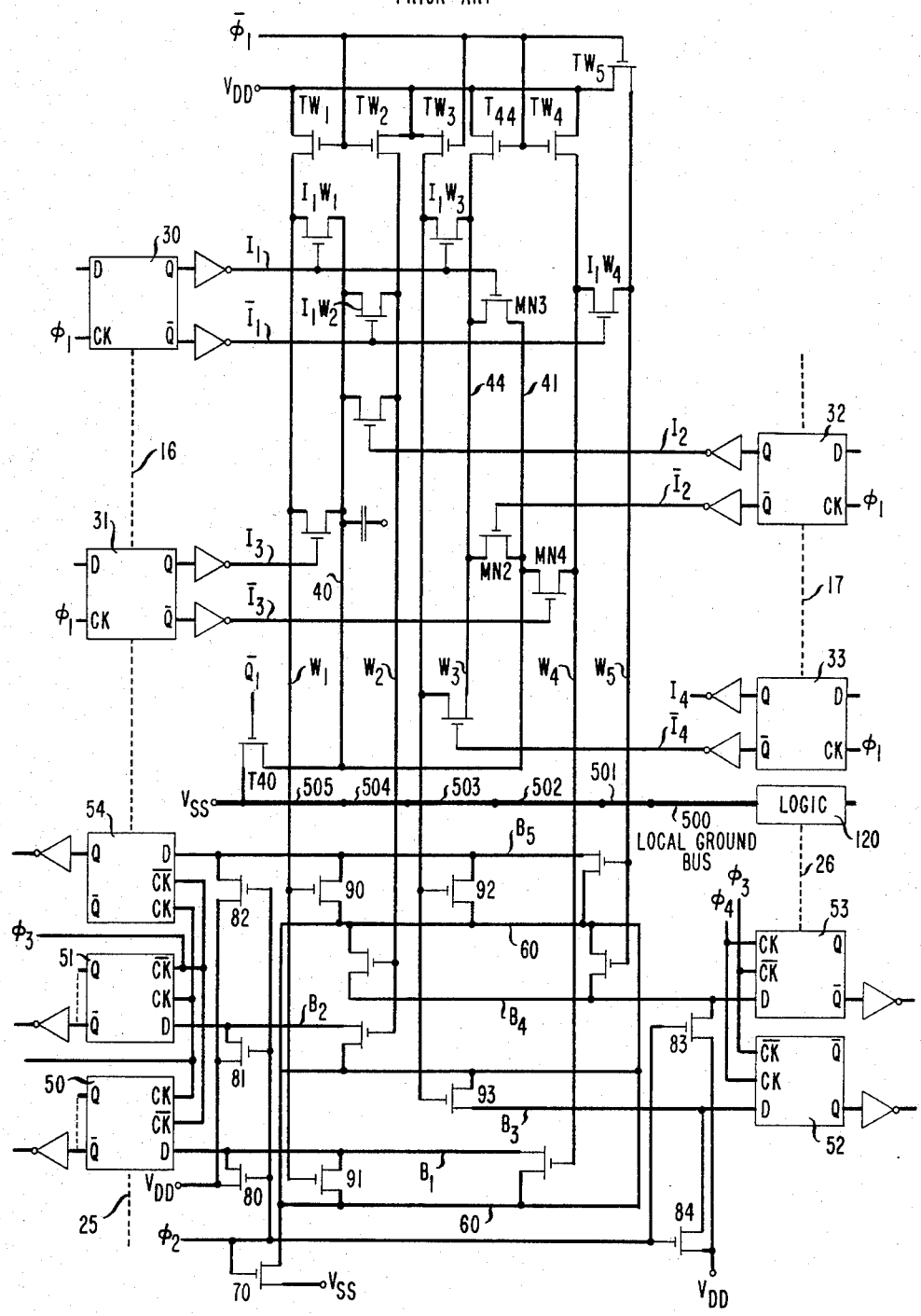
FIGS. 2 and 3 are schematic diagrams of a portion of the PLA of FIG. 1 in accordance with prior art teaching and in accordance with the teachings of the present invention, respectively.

FIG. 2 shows a prior art internal circuit arrangement of the PLA of FIG. 1 including representative circuit elements of AND and OR arrays 13 and 14 as well as input and output latches 16 and 17 and 25 and 26, respectively, as designated in the Figure. Input latches 16 and 17 are shown to include flip-flops 30 and 31 and 32 and 33, respectively. The Q and $\bar{Q}$ outputs of the flip-flops are connected to horizontal conductors designated $I_1$, $\bar{I}_1$, $I_2$, $\bar{I}_2$,—as shown. Vertical conductors $W_1$, $W_2$, $W_3$, $W_4$ and $W_5$ extend, downwardly as viewed, into the OR array 14. A PLA operates, in general, in two parts. The first part is the decoder operation in which the outputs of the decoder are specified for controlling the subsequent outputs of the ROM. The outputs of the decoder appear on the vertical lines which are designated "$W_i$" to represent the fact that they extend into the ROM section and constitute word lines in the ROM section.

The decoder operation is initiated by precharging all the word lines and selectively discharging the word lines according to the pattern of gate transistors in the decoder and the pattern of inputs into the decoder. The gate transistors are designated by the input lines $I_i$ and the word line to which the gate and source electrodes are connected. Accordingly, gate transistors $I_1W_2$ and $I_1W_4$ are located along conductors $I_1$ and $\bar{I}$, $W_2$ and $W_4$, respectively. Each word line is connected to a source of voltage $V_{DD}$ by associated p-channel field effect transistors (PFET's) $TW_1$, $TW_2$, $TW_3$, $TW_4$ and $TW_5$. Two additional vertical lines are shown, 40 and 41. These two lines are connected to a source of voltage $V_{SS}$ by means of n-channel field effect transistor T40. The gate electrodes of (p-channel) transistors $TW_1 \ldots TW_5$ and (n-channel) transistor T40 are connected to a source of $\phi_1$ clock pulses (negative going). An additional vertical conductor 44 is connected via PFET $TW_4$ to the source of voltage $V_{DD}$.

In operation, a $\phi_1$ clock pulse is applied and the word lines are precharged to $V_{DD}$. Latches 30, 31, 32 and 33 provide voltage levels at say the $\overline{Q}$, Q, $\overline{Q}$ and Q outputs, respectively. Consequently, conductors 40, 44 and 41 are charged to $V_{DD}$. When the $\phi_1$ clock pulse terminates, transistors $TW_1$, $TW_2$, $TW_3$, $TW_4$, and $TW_5$ turn off and transistor T40 turns on. Conductors 40 and 41 are now discharged to $V_{SS}$ (ground potential). Word line $W_1$ remains charged (to $V_{SS}$) providing an input to the ROM.

The ROM is organized in a manner quite similar to the decoder organization, the decoder word lines providing the inputs rather than the $I_i$ and $\bar{I}_i$ input lines as was the case with the decoder. The word lines intersect horizontal bit lines $B_1$, $B_2$, $B_3$, $B_4$ and $B_5$. The bit lines are connected to data inputs to associated latches 50, 51, 52, 53 and 54, respectively.

The ROM array too includes a pattern of (n-channel) gate transistors to the gate electrodes of which the word lines are connected. The source and drain electrodes are connected to the bit lines and to additional horizontal lines designated 60 and electrically interconnected to one another and to the drain electrode of n-channel transistor 70. The gate electrode of transistor 70 is connected to a source of clock pulses $\phi_2$ and the source electrode is connected to source of voltage $V_{SS}$.

The ROM is operative to provide an output along a selected bit line in a manner similar to the operation of the decoder. Specifically, a phase $\phi_2$ clock pulse is applied to the gate electrodes of each of p-channel field effect transistors 80, 81, 82, 83, and 84. In response, all the bit lines $B_1$-$B_5$ are charged to voltage $V_{DD}$. At the termination of the $\phi_2$ clock pulse, transistors 80 through 84 turn off and transistor (n-channel) 70 turns on. Consequently, conductor 60 discharges to $V_{SS}$. Because word line $W_1$ is still charged, transistors 90 and 91 are still activated and, consequently, bit lines $B_1$ and $B_5$ are discharged to voltage $V_{SS}$ while applying a data input to flip-flops 50 and 54, respectively, during a phase $\phi_3$ clock pulse. A zero input is applied to flip-flops 51, 52 and 53 during the $\phi_3$ pulse because word lines $W_2$, $W_3$, $W_4$ and $W_5$ are discharged when a $\phi_3$ pulse occurred.

In the prior art arrangement of FIG. 2 transistor T40 and transistor 70 are n-channel transistors and are located outside of a common PTUB diffusion region in which all the p-channel gate transistors of the decoder and ROM sections 13 and 14, respectively, are formed as shown in FIG. 2.

Figure 3:
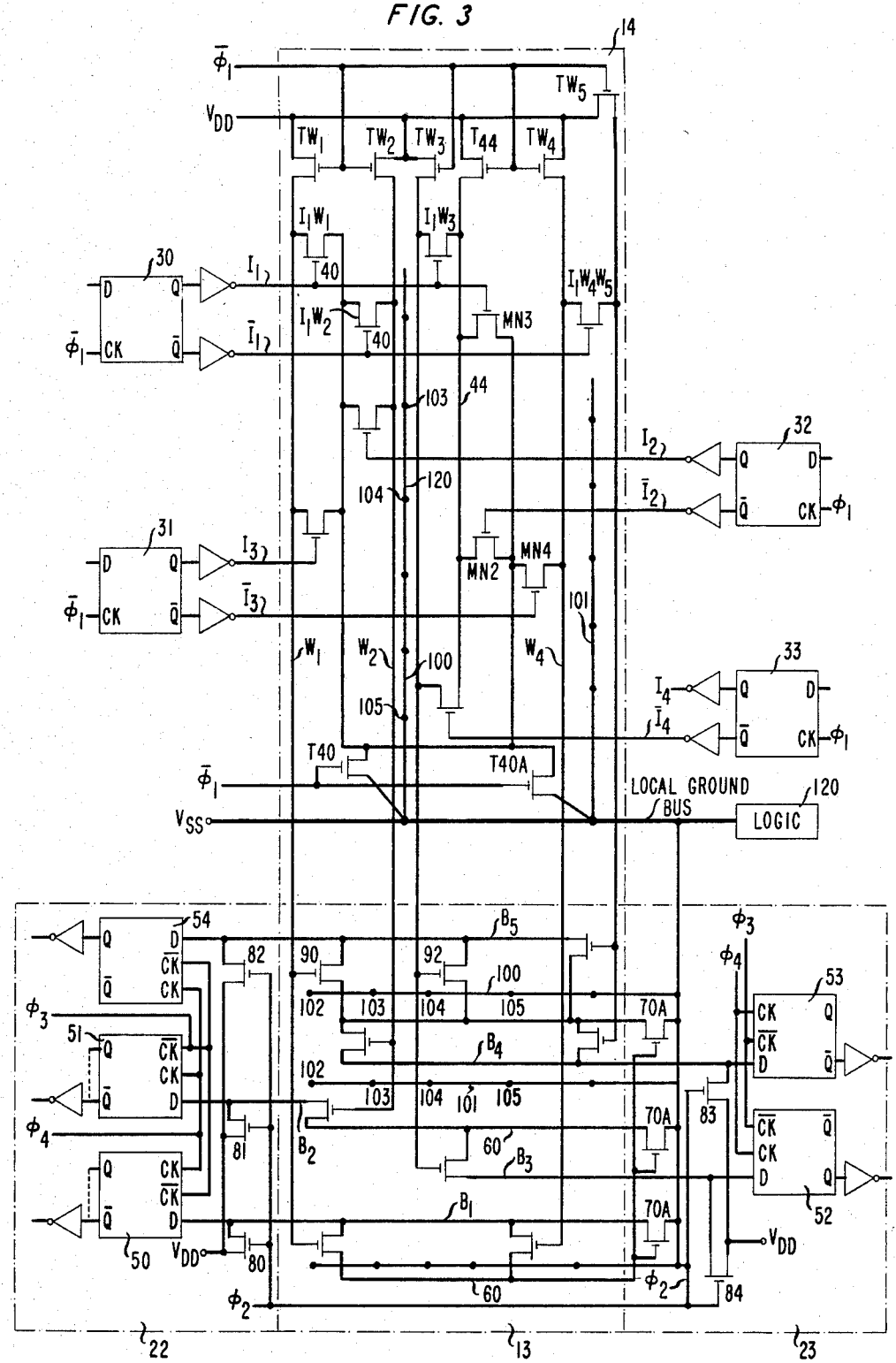

FIG. 3 shows a PLA similar to that shown in FIG. 2 but rearranged in accordance with the present invention. One important change relates to the relocation of transistors T40 and 70 to locations within the PTUB area as shown. Also, additional transistors, like T40A, . . . and 70A, . . . are arranged to replace transistors T40 and 70 of FIG. 2, respectively, and are operative in exactly the same manner as can be seen from the Figure. The additional transistors are added only to improve speed characteristics.

Figure 4:
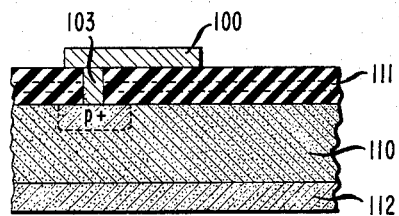
FIG. 4 is a cross section of a portion of the arrangement of FIG. 3.

The arrangement of FIG. 3 importantly also includes additional linear patterns of metal represented as line 100 or 101 each having a set of ohmic connections 102, 103, 104, 105 . . . to the p-channel substrate. It is to be noted that lines 100 and 101 are present in each of the decoder and ROM sections of the PLA. FIG. 4 shows, in cross section, the structure of chip 10 in which a line 100 or 101 (and the like) makes ohmic contact via metal through connections 103, through oxide layer 111 to PTUB 110 and epitaxial silicon film 112. Operation of the PLA of FIG. 3 is identical to that of FIG. 2.

Figure 5:
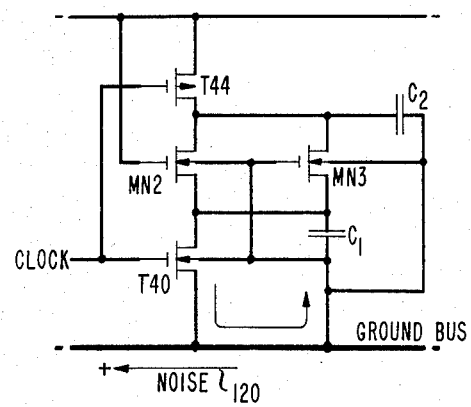
FIG. 5 is an equivalent circuit of a portion of the PLA decoder of FIG. 2.

FIG. 5 shows the equivalent circuit for transistors MN2, MN3, T40, and T44 (representing TW1 . . . TW5) of FIG. 2 along with parasitic capacitances C1 and C2 for noise currents in a representative portion of the decoder (or ROM) during a phase $\phi_3$ or a $\phi_2$ clock pulse when outputs occur from the decoder (or the ROM) in the arrangement of FIG. 2. The noise currents flow through ground switch (transistor) T40. These noise currents couple to associated logic circuits through the ground and power BUSES and operate to change signal levels in those circuits as is indicated by arrow 120 in FIG. 5.

Figure 6:
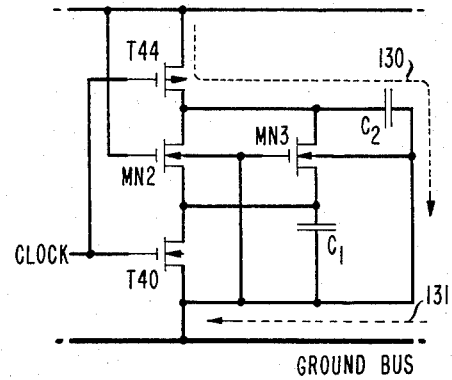
FIG. 6 is an equivalent circuit of the portion of the PLA of FIG. 3 configured in accordance with this invention.

The same circuit elements are shown in FIG. 6 in an equivalent circuit for the arrangement of FIG. 3 where T44 again represents transistors TW1 . . . TW5. Noise currents now circulate in local loops, provided by line 100, and through connections to the PTUB, as indicated by broken arrows 130 and 131.

Figure 7:
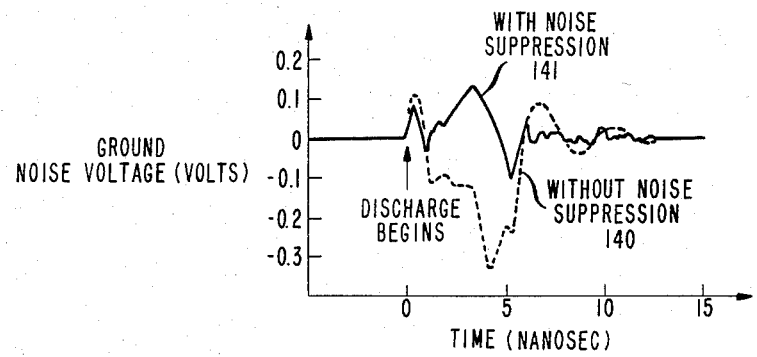
FIG. 7 is a plot of voltage versus time for the portions of the PLA configured as shown in each of FIGS. 5 and 6.

FIG. 7 shows a graph of noise voltage plotted against time. Broken curve 140 shows the noise without suppression as is characteristic of the prior art arrangement of FIG. 2. Solid curve 141 shows the noise characteristic of the arrangement of FIG. 3. It is clear from a comparison of curves 140 and 141 that the arrangement of FIG. 3 is characterized by significantly improved noise characteristics.

Improved noise characteristics are achieved by distributing ground connections throughout the logic array (decoder of FIG. 3) and by providing additional switches (T40 and T40A) to the ground BUS (VSS) thus providing closed loop paths for noise currents closely spaced to the origin of those currents and by eliminating loops for noise currents which include the power and ground BUSES. Although, the illustrative example for demonstrating the improved noise characteristics used a PTUB structure, any Complimentary Metal-Oxide-Semiconductor (CMOS) structure, pseudo NMOS and domino logic arrangement can be made to exhibit similar improved noise characteristics by providing closed loop noise paths therein.

Only two lines of ground connections are shown (100 and 101) in the decoder section of FIG. 3 along with two switches T40 and T40A. Space permitting, ground connections can be provided along each vertical line in the array as shown, each with an additional switch like T40. Such additional sets of ground connections and switches provide even more localized current loops and still more improved noise characteristics. It appears that if 10 percent of the vertical lines are provided with sets of ground connections and several switches like T40 are also provided (one in the center of the array), the improved characteristics of FIG. 7, curve 141, are achieved.

Figure 8:
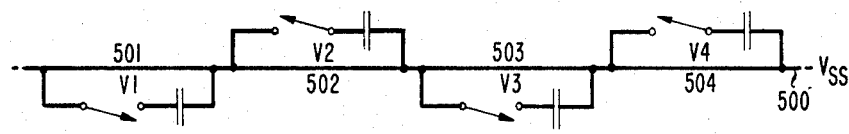
FIGS. 8 and 9 are schematic circuit diagrams of portions of the diagrams of FIGS. 2 and 3, respectively.
Figure 9:
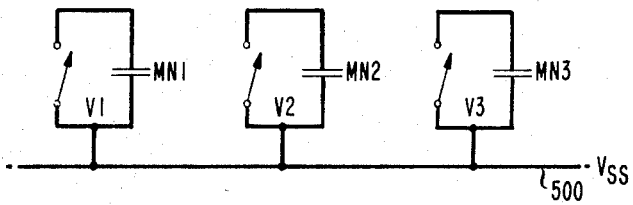

A comparison of FIGS. 8 and 9 underscores the advantages of the invention. The prior art circuit of FIG. 2 results in a series of voltage contributions $V_1$, $V_2$, $V_3$, $V_4$ generated along line 500 (the ground BUS) shown in FIG. 8 in segments 501, 502, 503 . . . therealong as shown in FIG. 2. FIG. 9 shows that the voltage contributions $V_1$, $V_2$, $V_3$ . . . are generated in local loops each including a switch such as MN2 and the associated capacitance as arranged as shown in FIG. 3. Consequently, by the provision of a distributed ground connection as shown in FIG. 3, no noise generated voltage contributions appear on the ground or power BUSES and thus do not affect the operation of logic circuitry driven by logic arrays so configured.

What is claimed is:

1. An integrated circuit chip including a first logic array comprising first and second linear patterns of conductors defining cross-points therebetween and a pattern of gates arranged at selected ones of said cross-points, means for charging the conductors of said second pattern, said gates being adapted to discharge ones of said conductors of said second pattern in response to signals on selected conductors of said first pattern, said circuit being characterized by parasitic capacitances associated with said selected gates operative for generating noise currents, said chip including BUS means, means for periodically connecting said BUS means to the conductors of said second pattern, and distributed ground means positioned in said chip in a manner to provide localized closed-loop paths for said noise currents in a manner to avoid generating voltage contributions therefrom in said BUS means.

2. An integrated circuit structure in accordance with claim 1 wherein each of a plurality of conductors of said second pattern is connected to a common ground through a separate ground switch.

3. An integrated circuit structure in accordance with claim 2 in which said first layer comprises a PTUB diffusion region and said gates and said ground switches are defined in said region.

4. An integrated circuit structure comprising first and second structures each in accordance with claim 3 wherein the conductors of said second pattern of said first structure are extended to become the conductors of said first pattern in said second structure, said first and second structures constituting decoder and ROM sections of a PLA, respectively.

5. An integrated circuit structure comprising a layer of semiconductor material and a first linear array of electrical conductors separated from said layer by a first insulating layer, said structure including a second linear array of electrical conductors oriented transverse to said first linear array, said first and second arrays including an insulating layer therebetween and defining cross-points with conductors of said first array, a pattern of transistors located at selected ones of said cross-points each having source, gate and drain electrodes, each of said transistors having its gate and source electrodes connected to a conductor of said first and second linear arrays, respectively, means for controllably raising said conductors of said second linear array to a first voltage level and means for selectively activating ones of said pattern of transistors in a manner to discharge selected conductors of said second linear array, said structure also including a third linear array of conductors having conductors parallel to at least two conductors of said second linear array, and a plurality of ohmic connections between each conductor of said third array and said first layer.

6. A logic circuit arrangement comprising an integrated circuit chip including a first semiconductor layer and first and second spaced apart conductor arrays oriented at right angles to one another, said circuit also comprising means for selectively charging selected ones of said second conductor array to a first voltage level responsive to inputs to ones of said first conductor array, said means including switching devices positioned in accordance with a preselected pattern at cross-points between associated conductors of said first and second array, a third array of conductors associated with conductors of said second array and having a plurality of ohmic connections to said first semiconductor layer, the conductors of said third array being connected via switching means to ground in a manner to provide a plurality of closed loop ground paths locally through said first semiconductor layer and through associated transistors at said cross-points.

7. A logic circuit arrangement comprising an integrated circuit including first and second arrays of electrical conductors disposed perpendicularly with respect to one another and defining cross-points therebetween, a pattern of gates arranged at selected ones of said cross-points and being adapted to selectively discharge ones of said conductors of said second array in response to inputs to selected conductors of said first array, output means connected to the conductors of said second array, said output means being adapted to provide coded signals representative of said inputs and said pattern, said arrangement including a distributed ground arrangement positioned with respect to the conductors of said second array to reduce voltage contributions from noise currents from selected ones of said gates when outputs occur.

8. A circuit arrangement comprising an integrated circuit chip including first and second arrays of electrical conductors disposed transverse to one another and defining cross-points therebetween, a pattern of gates arranged at selected ones of said cross-points and being adapted to selectively discharge ones of said conductors of said second array in response to inputs to selected conductors of said first array, said arrangement being characterized by a parasitic capacitance associated with each selected one of said gates, output means connectable to said conductors when clocked to provide outputs therefrom, said arrangement including a distributed ground arrangement positioned to reduce voltage contributions from currents generated by said capacitors when associated selected ones of said gates are activated to discharge said conductors of said second array.

* * * * *